United States Patent
Sun et al.

(10) Patent No.: US 6,680,254 B2
(45) Date of Patent: Jan. 20, 2004

(54) METHOD OF FABRICATING BIT LINE AND BIT LINE CONTACT PLUG OF A MEMORY CELL

(75) Inventors: Yu-Chi Sun, Pingjen (TW); Tse-Yao Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 135 days.

(21) Appl. No.: 09/939,110

(22) Filed: Aug. 24, 2001

(65) Prior Publication Data

US 2002/0119649 A1 Aug. 29, 2002

(30) Foreign Application Priority Data

Feb. 27, 2001 (TW) ........................... 90104624 A

(51) Int. Cl.$^7$ ............................. H01L 21/311
(52) U.S. Cl. ..................... 438/700; 438/675; 438/702
(58) Field of Search ..................... 438/638, 639, 438/640, 700, 701, 702, 675, 684

(56) References Cited

U.S. PATENT DOCUMENTS 6,165,898 A * 12/2000 Jang et al. ............... 438/638
6,300,235 B1 * 10/2001 Feldner et al. ........... 438/618
6,323,118 B1 * 11/2001 Shih et al. ............... 438/624

* cited by examiner

*Primary Examiner*—Caridad Everhart
(74) *Attorney, Agent, or Firm*—Ladas & Parry

(57) ABSTRACT

A memory cell fabrication avoiding bit line encroaching. A first insulating layer and a first masking layer are formed on a semiconductor substrate with a diffused region. The first masking layer and the first insulating layer are defined to form a first trench above the diffusion region. A second masking layer is formed to fill the first trench, and a hole is formed by removing a portion of the second masking layer above the diffusion region. A bit line contact is formed by removing a portion of the first insulating layer beneath the hole to expose the diffusion region. A bit line contact plug is formed by filling the bit line contact with a first conductive layer. The residual second masking layer and the first masking layer are removed to form a second trench. A bit line is formed by filling the second trench with a second conductive layer.

15 Claims, 8 Drawing Sheets

METHOD OF FABRICATING BIT LINE AND BIT LINE CONTACT PLUG OF A MEMORY CELL

BACKGROUND OF THE INVENTION

1. Field of the Invention

The present invention relates to a method of fabricating a bit line and contact plug for a dynamic random access memory (DRAM) cell, and more particularly to the fabrication of a bit line and a bit line contact plug for the DRAM cell.

2. Description of the Prior Art

A DRAM cell comprises a metal-oxide-semiconductor field effect transistor (MOSFET) and a capacitor that are built in a semiconductor silicon substrate. There is an electrical contact between the drain of a MOSFET and the bottom storage electrodes of the adjacent capacitor, forming a memory cell of the DRAM device. A large number of memory cells make up the cell arrays, which combine with the peripheral circuit to produce DRAMs.

In recent years, the dimensions of the MOSFETs have continuously shrunk so that the packing densities of these DRAM devices have increased considerably; thus, the dimensions of the MOSFETs and capacitors have become smaller; the line width of word lines, bit lines, and metal lines have become narrower; the distance between two bit lines, word lines or metal lines have also become closer. Since bit line contact plug connects bit line and drain region, and the bit line is on the top of the bit line contact plug. In conventional processes, formation of the bit line contact plug usually takes place before that of the bit line. The conventional processes for fabrication of the bit line and the bit line contract plug follow.

Referring to FIG. 1A, in this figure, bit lines 160, word lines 102, active areas 104, source/drain region 112, and bit line contact plug 142 are shown on the layout of the memory cell array of a DRAM cell.

FIG. 1B is a sectional view along the A—A line of FIG. 1A. In conventional processes, a semiconductor substrate 100 is provided, using a LOCOS Oxidation process to form a field insulating layer (not shown) on the substrate 100. The field insulating layer isolates each Active Area. Thereafter, ordinary semiconductor processes, such as deposition, photolithography and ion implantation are used to form the transistor (not shown). The transistor is composed of a gate (not shown) and diffusion areas, such as the source/drain region 112. Then, a first insulating layer 120, which is made of borophosphosilicate glass (identified as BPSG hereafter), is formed to isolate the gate.

Referring to FIG. 1C, a photoresist layer 130 is formed on the first insulating layer 120. After the photoresist layer 130 is defined, the first insulating layer 120 is defined to form a bit line contact window 140, which exposes the surface of the source/drain region 112.

Referring to FIG. 1D, a first conductive layer (not shown) is deposited to fill up the bit line contact window 140. Then, a bit line contact plug 142 is formed, which electrically connects the source/drain region 112.

Referring to FIG. 1E, by photolithography and etching, the top portion of the bit line contact plug 142 is defined to form a trench 150.

Referring to FIG. 1F, a bit line 160 is formed by depositing a second conductive layer (not shown) to fill up the trench 150. The bit line 160 electrically connects the source/ drain region 112 through the bit line contact plug 142. Manufacture of the bit line and the bit line contact plug of a memory cell is then completed.

Since memory devices have become highly integrated, the line width of a memory cell has been reduced to less than 0.08 micrometer. For conductive structures, however, the narrowed line width increases electrical resistance, and thus, increases the loss of current and heat generated by the device, and decreases the efficiency of the device. Accordingly, to reduce the electrical resistance, the increased line width of a device is necessary. And hence, in order to reduce the electrical resistance between the bit line contact plug and the source/drain region or the bit line and the bit line contact, enlarging the diameter of the bit line contact plug is necessary. Note the processes of a 0.14-micrometer device as an example. The distance between two neighboring bit lines is also about 0.14 micrometer. In order to reduce the electrical resistance, the ideal diameter of the bit line contact plug is about 0.17 to 0.18 micrometer. Using the processes of a 0.11 micrometer device as another example, the distance between two neighboring bit lines is about 0.11 micrometer. The ideal diameter of the bit line contact plug is about 0.13 to 0.14 micrometer. The distance between two bit lines cannot be less than 0.11 micrometer. The diameter of the bit line contact plug is usually larger than the distance between two neighboring bit lines. If misalignment occurs during the formation of the bit lines, two neighboring bit lines may possibly encroach on two neighboring bit line contact plugs. FIG. 1G shows two neighboring bit line encroaching on two neighboring bit line contact plugs because of misalignment in photolithography. The juxtaposition can cause a short circuit, resulting in failure of the operation of a DRAM device.

SUMMARY OF THE INVENTION

Accordingly, an object of the present invention is to provide a method for fabricating the bit line and the bit line contact plug of a semiconductor memory device, especially to avoid a bit line encroaching on two neighboring bit line contact plugs, which can cause short circuit or failure of the DRAM device.

In order to achieve the above object, a method of fabricating a bit lines and a bit line contact plug according to an embodiment of the present invention is disclosed. A semiconductor substrate having a transistor, comprising at least one diffused region formed thereon and overlaid by a first insulating layer is provided. A first masking layer is formed on the first insulating layer. The first masking layer and the first insulating layer are defined to form a first trench, which is above the diffusion region. A second masking layer is formed to fill up the first trench. A hole is formed by removing a portion of the second masking layer, which is above the diffusion region. A bit line contact window is formed by removing a portion of the first insulating layer right beneath the hole until the surface of the diffusion region is exposed. A bit line contact plug is formed by forming a first conductive layer to fill the bit line contact window. The residual second masking layer is removed to form a second trench. Thereafter, the first masking layer is removed. A bit line is formed by forming a second conductive layer to fill the second trench, Thus, the fabrication of the bit line and the bit line contact plug of a memory cell is complete.

BRIEF DESCRIPTION OF THE DRAWINGS

The accompanying drawings form a material part of this description, in which.

DETAILED DESCRIPTION OF THE PREFERRED EMBODIMENT

The invention disclosed herein is directed to a method of fabricating a bit line and a bit line contact plug of DRAMs. In the following description, numerous details are set forth in order to provide a thorough understanding of the present invention. It will be appreciated by ones skilled in the art that variations of these specific details are possible while still achieving the results of the present invention. Well-known processing steps are not described in detail in order to not obscure the present invention.

Figure 1A:
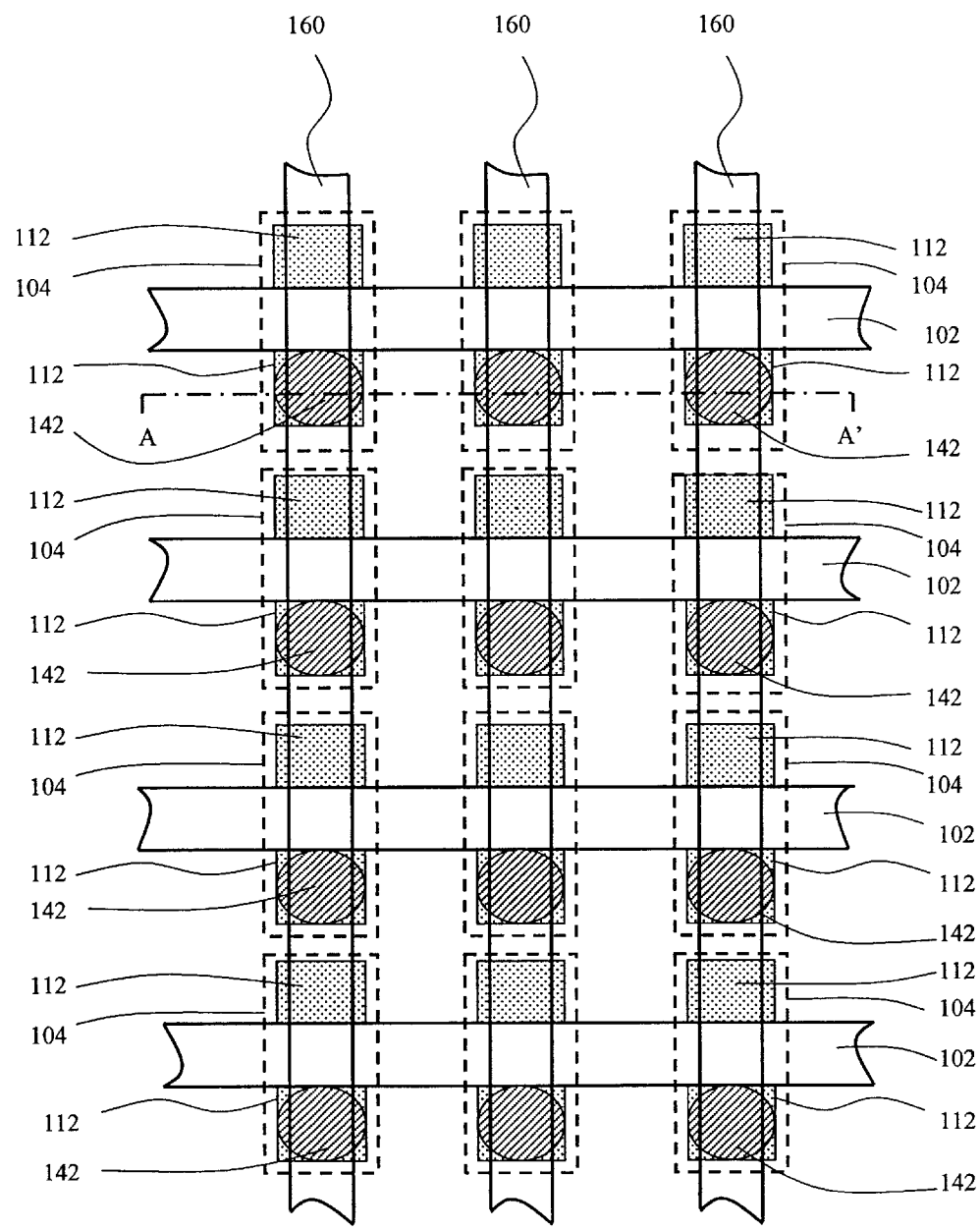
FIG. 1A shows a layout of memory cell array of DRAM cells.
Figure 1B:
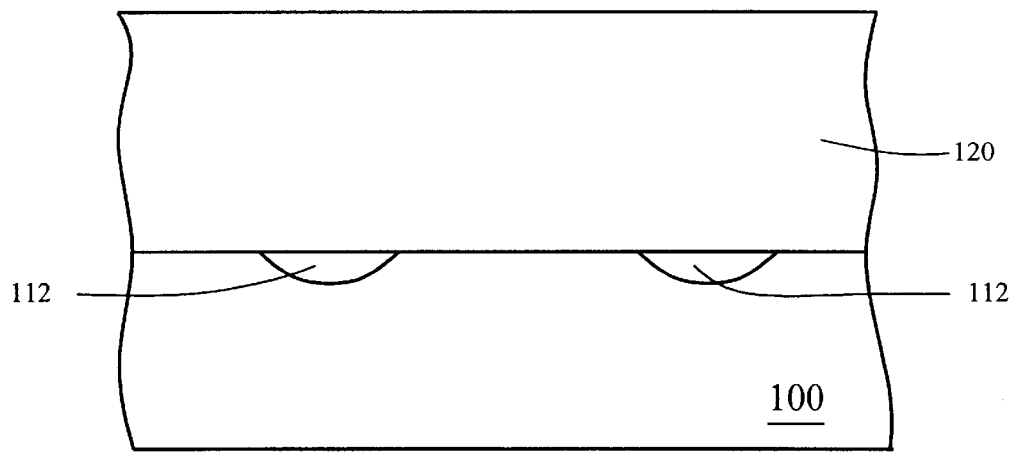
FIGS. 1B through 1F show schematic cross-sectional views of a partially fabricated integrated circuit structure at successive stages in the formation of the bit line and the bit line contact plug of a DRAM cell of the prior art.
Figure 1C:
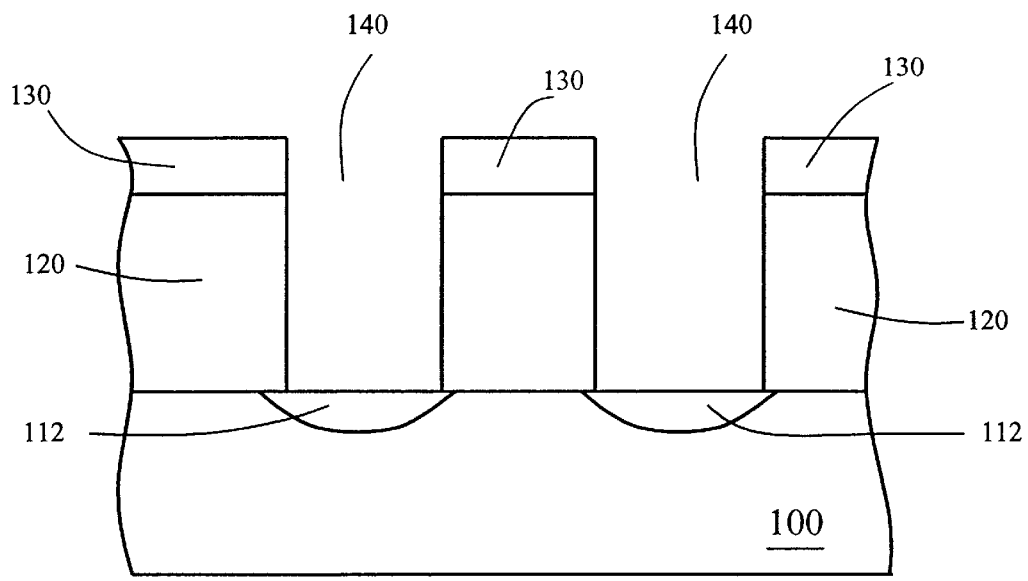
Figure 1D:
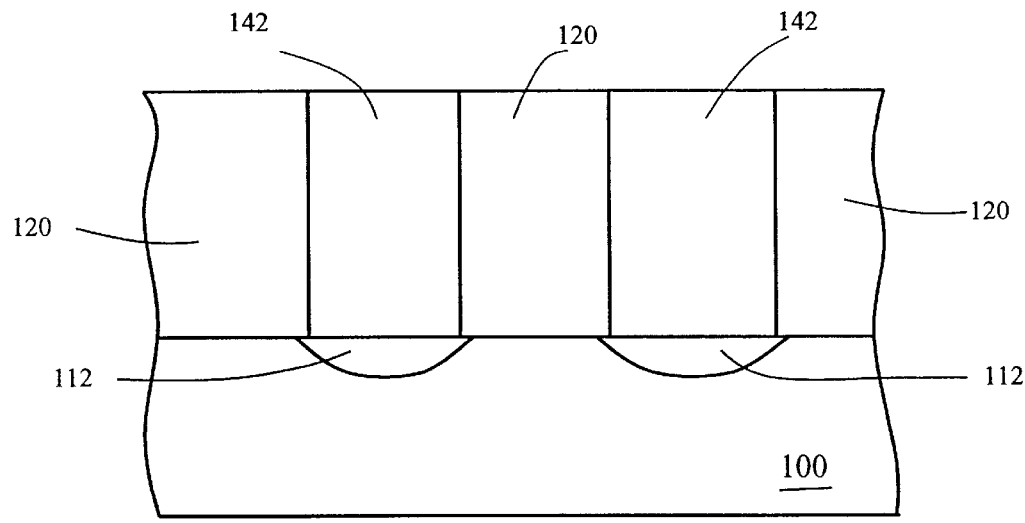
Figure 1E:
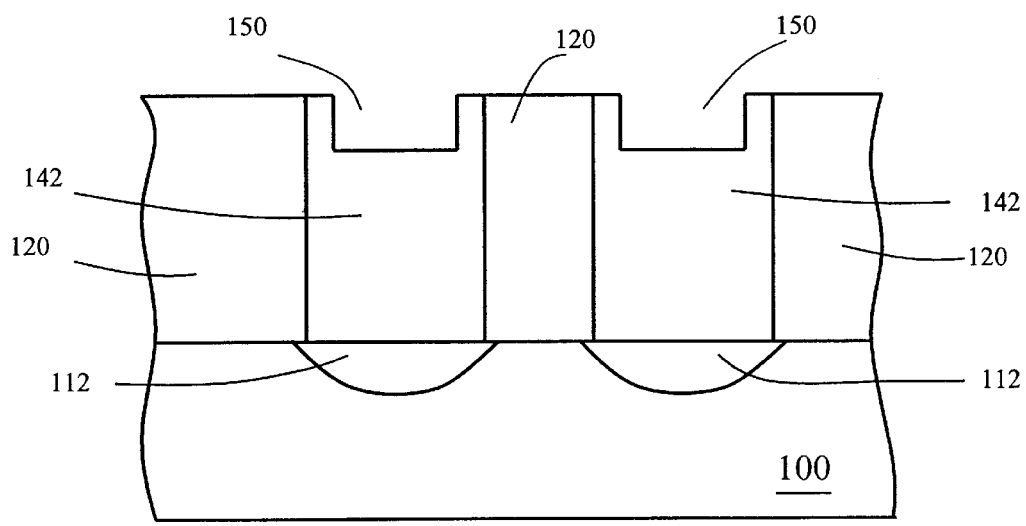
Figure 1F:
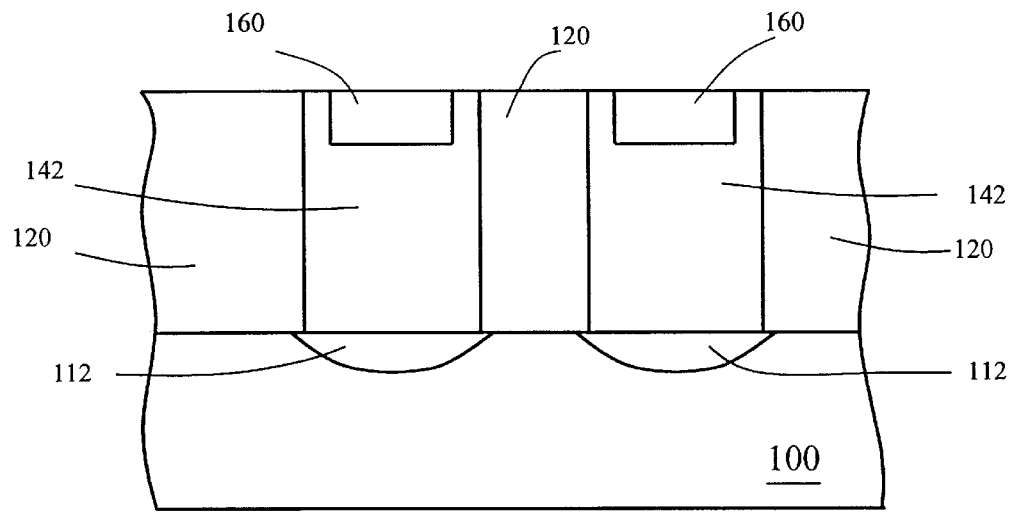
Figure 1G:
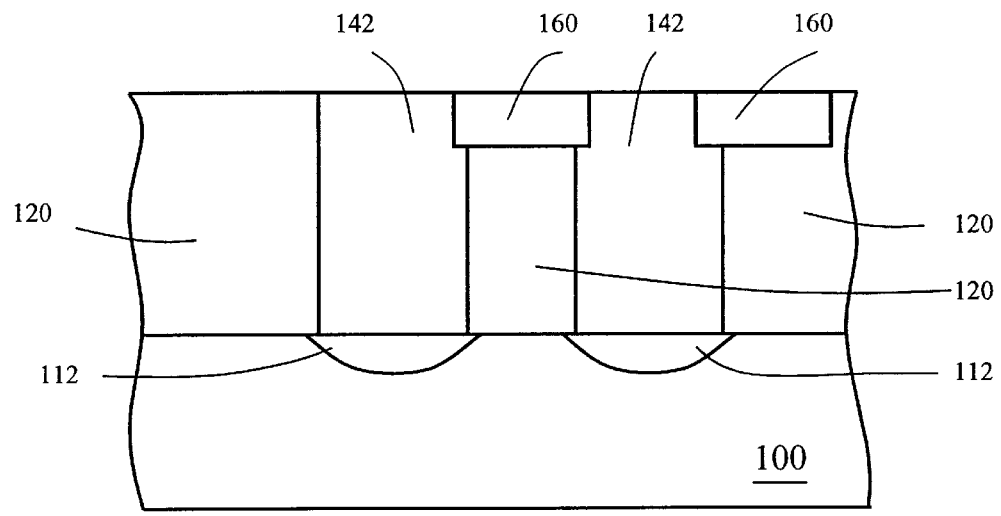
FIG. 1G shows schematic cross-sectional views of two neighboring bit lines encroaching on two neighboring bit line contact plugs because of misalignment in photolithography.
Figure 2A:
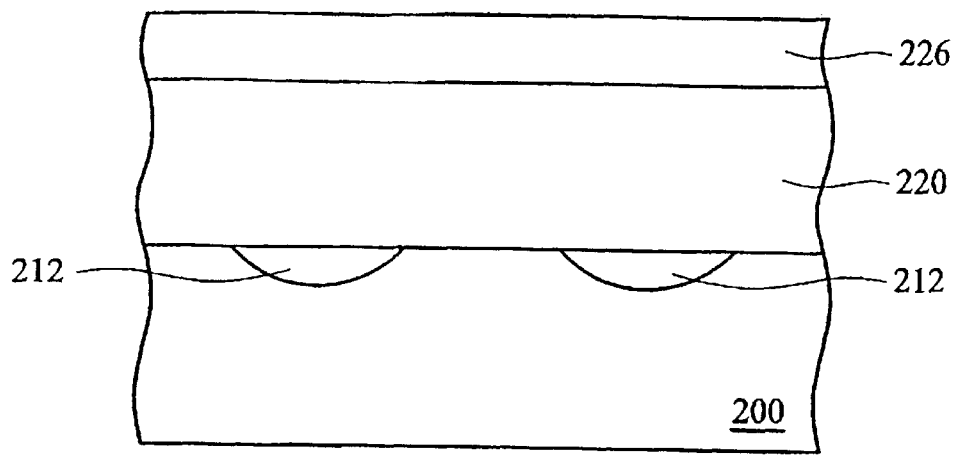
FIGS. 2A through 2H show schematic cross-sectional views of a partially fabricated integrated circuit structure at successive stages in the formation of the bit line and the bit line contact plug of a DRAM cell according to an embodiment of the present invention.

Referring now to FIG. 2A, a semiconductor substrate 200 is provided. The semiconductor substrate 200 is composed of silicon or germanium. The substrate 200 can be made by Epitaxial silicon or silicon on insulator (SOI). For simplicity, a P-type semiconductor silicon substrate 200 is taken as an example in this invention. A field insulating layer (not shown) is formed by shallow trench isolation and oxidation. The field insulating layer isolates the active area (not shown). Then, ordinary semiconductor process, such as deposition, photolithography or ion implantation is used to form the transistor (not shown). The transistor is composed of a gate (not shown) and diffusion areas, such as the source/drain region 212. Next, a first insulating layer 220, which has a thickness of about 6000 to 10000 angstroms, can be made of BPSG, non-doped silicate glass, high density plasma oxide, or TEOS. The first insulating layer 220 can be formed by CVD, APCVD, SAPCVD, LPCVD, PECVD, and high density plasma CVD. Thereafter, the first insulating layer 220 is planarized by thermal reflow, etchback or chemical mechanical polishing (CMP) techniques. A first masking layer 226, which can be made of nitride or polycrystalline silicon, is formed on the first insulating layer 220. The first masking layer 226 has a thickness of about 1500 to 3000 angstroms.

Figure 2B:
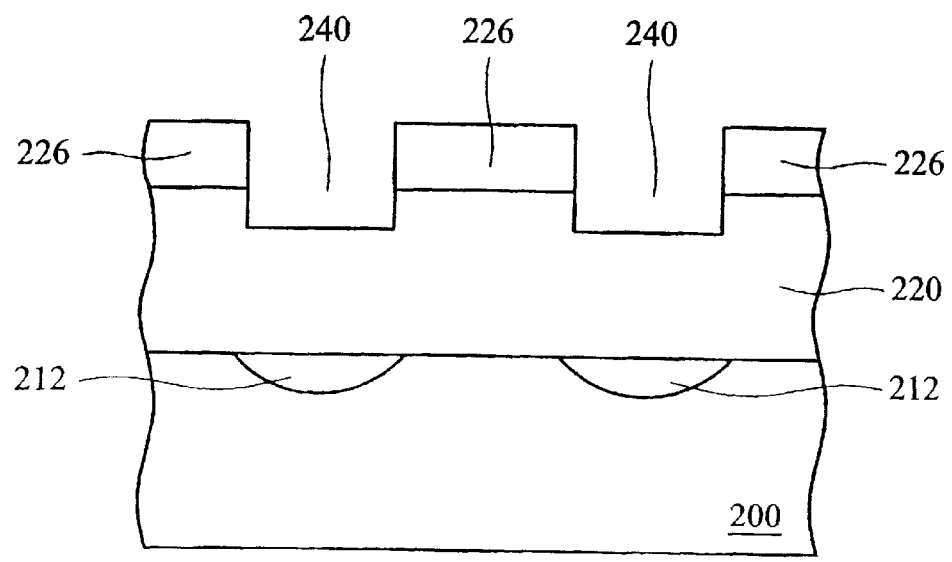

Referring to FIG. 2B, the first masking layer 226 is defined. The first insulating layer 220 is defined using the first masking layer 226 as a mask. A portion of the first masking layer 226 and the first insulating layer 220 are removed by anisotropic etching to form a trench 240, which is above the source/drain region 212. The trench 240 has a depth of about 1500 to 3000 angstroms.

Figure 2C:
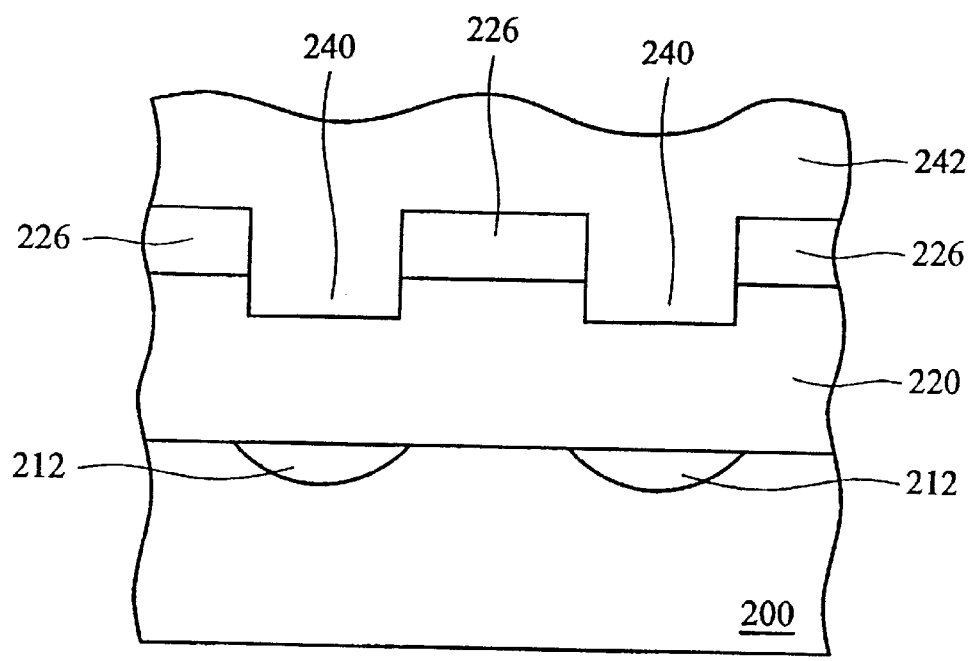
Figure 2D:
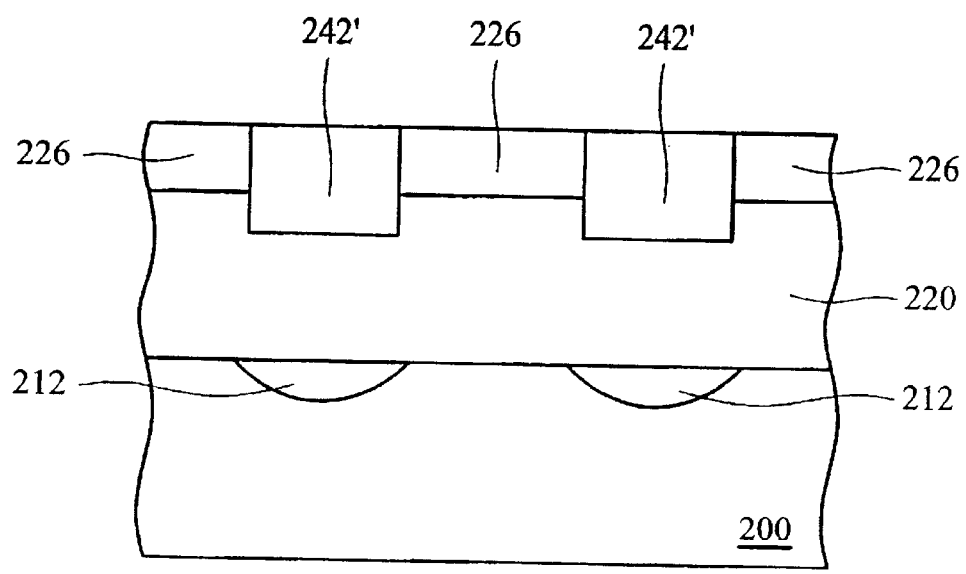

Referring to FIG. 2C, a second masking layer 242, which is made of nitride or polycrystalline silicon, is formed on the first masking layer 226 and fills the trench 240. The second masking layer 242 can be formed by LPCVD and has a thickness of about 2000 to 4000 angstroms. The materials of the second masking layer 242 and the first masking layer 226 have to be different for the present invention. If the first masking layer 226 is made of nitride, the second masking layer 242 has to be made of polycrystalline silicon. On the other hand, if the first masking layer 226 is made of polycrystalline silicon, the second masking layer 242 has to be made of nitride. Then, by etch back or planarization, the second masking layer 242 on the first masking layer 226 is removed but the portion in the trench 240 remains. In this step, the first masking layer 226 is used as the stop layer. The remaining second masking layer 242 takes as the residual second masking layer 242' hereinafter, as shown in FIG. 2D.

Figure 2E:
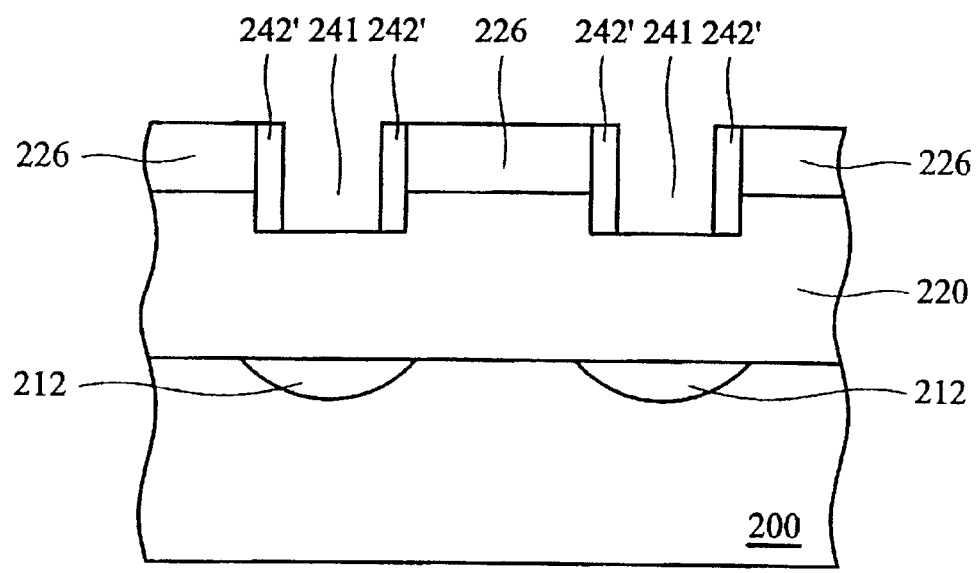
Figure 2F:
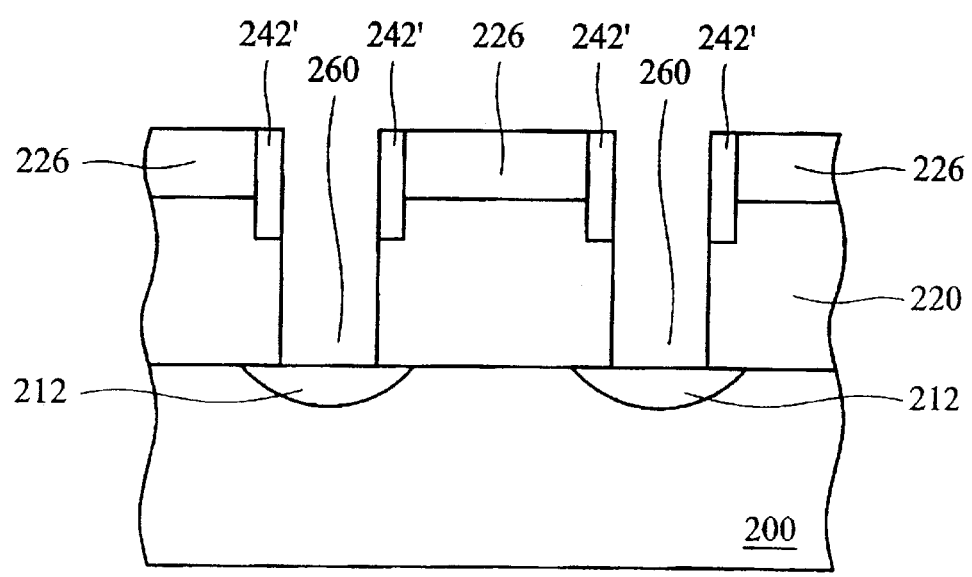

Referring to FIG. 2E, a portion of the residual second masking layer 242' above the source/drain region 212 is removed by photolithography and etching to form a hole 241. Then, using the first masking layer 226 and the residual second masking layer 242' as a mask, an etching is performed to remove a portion of the first insulating layer 220 right beneath the hole 241 until the surface of the source/drain region 212 is exposed. Then, a bit line contact window 260 is formed, as shown in FIG. 2F. The etching is usually an anisotropic etching, using carbon fluoride and its relative compound gases, such as $C_2F_4$, $C_4F_6$, $C_4F_8$, and $C_5F_8$ as etchant, the etching rate of nitride or polycrystalline silicon is much lower than that of oxide. In this situation, the etching selectivity of nitride or polycrystalline silicon to oxide is 1:10. The carbon fluoride and its relative compound gases are bombarded into a free radical state, such as CF and $CF_2$, by plasma during anisotropic etching. These radicals easily react with oxygen molecules contained in the BPSG, which is the first insulating layer 220, to form $CO_2$ gas. The $CO_2$ gas then dissipates into the air. The carbon fluoride and its relative compound gases radicals react very little with silicon molecules contained in the first masking layer 226 or second masking layer 242. The flow rate of the carbon fluoride compounds is about 5 to 50 sccm (standard cc per minute); the reaction pressure is about 30 to 80 m Torr; and the reaction time is about 1 to 10 minutes.

Figure 2G:
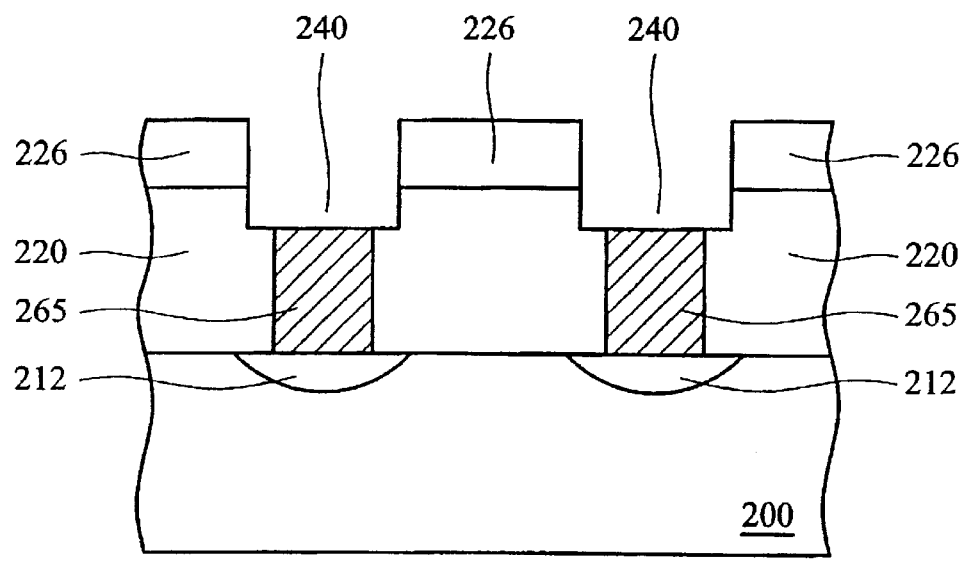

Referring to FIG. 2G, a first conductive layer (not shown) is formed on the first masking layer 226 and fills up the bit line contact window 260. The first conductive layer, which can be made of polycrystalline silicon, tungsten, tungsten silicide or other metal silicide formed by LPCVD, has a thickness of about 2000 to 4000 angstroms. The first conductive layer on the first masking layer 226 is then removed. The first conductive layer remaining in the bit line contact window 260 forms the bit line contact plug 265. Afterwards, isotropic etching is performed to remove the residual second masking layer 242' and then the trench 240 is recovered. Since the material of the first masking layer 226 is different from that of the residual second masking layer 242', after the residual second masking layer is removed, the first masking layer 226 remains.

Figure 2H:
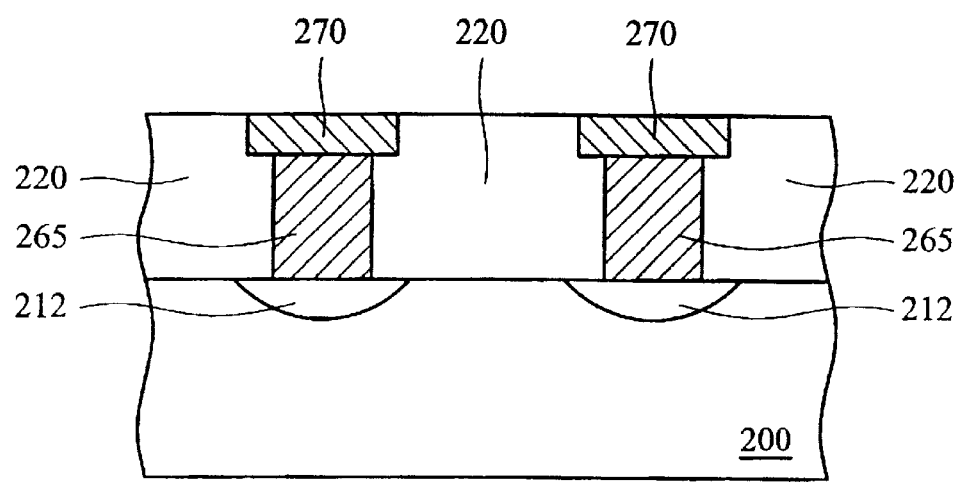

Referring to FIG. 2H, the first masking layer 226 is removed by isotropic etching. A second conductive layer (not shown) is formed on the first insulating layer 220 and fills up the trench 240. The second conductive layer, which can be made of polycrystalline silicon, tungsten, tungsten silicide or other metal silicide formed by LPCVD, has a thickness of about 2000 to 4000 angstroms. The second conductive layer on the first insulating layer 220 is then removed. The second conductive layer remaining in the trench 262 forms the bit line 270. The fabrication of a bit line 270 and bit line contact plug 265 of a memory cell is then completed.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of fabricating a bit line contact plug of a memory cell, comprising providing a semiconductor substrate having a transistor, comprising at least one diffusion region, formed thereon and overlaid by an insulating layer;

forming a first masking layer on said insulating layer;

patterning said first masking layer and said insulating layer to form a first trench, said first trench being located above the diffusion region;

forming a second masking layer to fill said first trench;

forming a hole by removing a portion of said second masking layer;

forming a bit line contact window by removing a portion of said insulating layer right beneath said hole until a surface of said diffusion region is exposed;

forming a bit line contact plug by filling said bit line contact window with a first conductive layer;

removing a residual portion of said second masking layer after forming said bit line contact plug, to form a second trench;

removing said first masking layer after removing said residual portion of said second masking layer; and forming a bit line by filling said second trench with a second conductive layer.

2. The method of claim 1, wherein the semiconductor substrate is made of silicon.

3. The method of claim 1, wherein said insulating layer is composed of a material selected from the group consisting of BPSG, non-doped silicate glass, high density plasma oxide, or TEOS.

4. The method of claim 1, wherein said insulating layer has a thickness of about 6000 to 10000 angstrom.

5. The method of claim 1, wherein said first masking layer has a thickness of about 1500 to 3000 angstroms.

6. The method of claim 1, wherein said first trench has a depth of about 1500 to 3000 angstroms.

7. The method of claim 1, wherein said second masking layer has a thickness of about 2000 to 4000 angstroms.

8. The method of claim 1, wherein the material of said first masking layer and said second masking layer are different.

9. The method of claim 1, wherein the formation of said bit line contact window is accomplished by anisotropic etching.

10. The method of claim 8, wherein said anisotropic etching is performed using an etchant composed of a material selected from the group consisting of carbon fluoride, $C_2F_4$, $C_4F_6$, $C_4F_8$, and $C_5F_8$.

11. The method of claim 1, wherein said first conductive layer is composed of a material selected from the group consisting of polycrystalline silicon, tungsten, tungsten silicide or other metal silicide.

12. The method of claim 1, wherein said first conductive layer has a thickness of about 2000 to 4000 angstroms.

13. The method of claim 1, wherein said second conductive layer is composed of a material selected from the group consisting of polycrystalline silicon, tungsten, tungsten suicide or other metal silicide.

14. The method of claim 1, wherein said second conductive layer has a thickness of about 2000 to 4000 angstroms.

15. The method of claim 1, wherein one layer among said first masking layer and second masking layer is made of nitride and another layer among said first masking layer and second masking layer is made of polycrystalline silicon.

* * * * *